US009893147B2

(12) United States Patent
Loubet et al.

(10) Patent No.: US 9,893,147 B2
(45) Date of Patent: Feb. 13, 2018

(54) FULLY SUBSTRATE-ISOLATED FINFET TRANSISTOR

(71) Applicant: STMICROELECTRONICS, INC., Coppell, TX (US)

(72) Inventors: Nicolas Loubet, Guilderland, NY (US); Prasanna Khare, Schenectady, NY (US)

(73) Assignee: STMICROELECTRONICS, INC., Coppell, TX (US)

( * ) Notice: Subject to any disclaimer, the term of this patent is extended or adjusted under 35 U.S.C. 154(b) by 0 days.

(21) Appl. No.: 15/345,250

(22) Filed: Nov. 7, 2016

(65) Prior Publication Data

US 2017/0053981 A1    Feb. 23, 2017

Related U.S. Application Data

(60) Continuation of application No. 14/587,872, filed on Dec. 31, 2014, now Pat. No. 9,520,393, which is a (Continued)

(51) Int. Cl.
*H01L 27/01* (2006.01)
*H01L 29/06* (2006.01)
(Continued)

(52) U.S. Cl.
CPC .... *H01L 29/0653* (2013.01); *H01L 21/02532* (2013.01); *H01L 21/02661* (2013.01);
(Continued)

(58) Field of Classification Search
CPC . H01L 21/84; H01L 27/1214; H01L 27/1203; H01L 2924/00; H01L 21/845
(Continued)

(56) References Cited

U.S. PATENT DOCUMENTS 6,413,802 B1   7/2002  Hu et al.
7,101,763 B1   9/2006  Anderson et al.
(Continued)

FOREIGN PATENT DOCUMENTS

DE    10 2010 029527 A1    12/2011

OTHER PUBLICATIONS

"New Transistor Grows in the Third Dimension," NYTimes.com, dated May 5, 2011, accessed on Sep. 13, 2012, retrieved from URL=http://graphics8.nytimes.com/images/2011/05/05/science/05chip_graphic/05chip_graphic-popup-v2.jpg, 1 page.
(Continued)

*Primary Examiner* — Andy Huynh
(74) *Attorney, Agent, or Firm* — Seed Intellectual Property Law Group LLP

(57) ABSTRACT

Channel-to-substrate leakage in a FinFET device is prevented by inserting an insulating layer between the semiconducting channel and the substrate during fabrication of the device. Similarly, source/drain-to-substrate leakage in a FinFET device is prevented by isolating the source/drain regions from the substrate by inserting an insulating layer between the source/drain regions and the substrate. Forming such an insulating layer isolates the conduction path from the substrate both physically and electrically, thus preventing current leakage. In an array of semiconducting fins made up of a multi-layer stack, the bottom material is removed thus yielding a fin array that is suspended above the silicon surface. A resulting gap underneath the remaining top fin material is then filled with oxide to better support the fins and to isolate the array of fins from the substrate.

24 Claims, 14 Drawing Sheets

Related U.S. Application Data division of application No. 13/725,528, filed on Dec. 21, 2012, now Pat. No. 8,956,942.

(51) Int. Cl.

| | | |
|---|---|---|
| *H01L 21/762* | (2006.01) | |
| *H01L 21/8234* | (2006.01) | |
| *H01L 27/088* | (2006.01) | |
| *H01L 29/16* | (2006.01) | |
| *H01L 29/49* | (2006.01) | |
| *H01L 21/02* | (2006.01) | |
| *H01L 21/3065* | (2006.01) | |
| *H01L 21/308* | (2006.01) | |
| *H01L 21/3105* | (2006.01) | |
| *H01L 29/08* | (2006.01) | |
| *H01L 29/165* | (2006.01) | |
| *H01L 29/66* | (2006.01) | |
| *H01L 29/78* | (2006.01) | |

(52) U.S. Cl.
CPC ........ *H01L 21/308* (2013.01); *H01L 21/3065* (2013.01); *H01L 21/31053* (2013.01); *H01L 21/762* (2013.01); *H01L 21/76224* (2013.01); *H01L 21/823418* (2013.01); *H01L 21/823431* (2013.01); *H01L 21/823481* (2013.01); *H01L 27/0886* (2013.01); *H01L 29/0847* (2013.01); *H01L 29/16* (2013.01); *H01L 29/165* (2013.01); *H01L 29/49* (2013.01); *H01L 29/66545* (2013.01); *H01L 29/7848* (2013.01)

(58) Field of Classification Search
USPC .......................................................... 257/347
See application file for complete search history.

(56) References Cited

U.S. PATENT DOCUMENTS

| | | |
|---|---|---|
| 7,427,794 B2 | 9/2008 | Chau et al. |
| 7,456,476 B2 | 11/2008 | Hareland et al. |
| 7,973,389 B2 | 7/2011 | Rios et al. |
| 8,120,073 B2 | 2/2012 | Rakshit et al. |
| 8,441,072 B2 | 5/2013 | Tsai et al. |
| 2004/0217434 A1 | 11/2004 | Lee et al. |
| 2007/0267695 A1 | 11/2007 | Lee |
| 2008/0085587 A1 | 4/2008 | Wells et al. |
| 2008/0237655 A1 | 10/2008 | Nakabayashi et al. |
| 2009/0090976 A1 | 4/2009 | Kavalieros et al. |
| 2009/0230478 A1 | 9/2009 | Pillarisetty et al. |
| 2010/0015778 A1 | 1/2010 | Lin et al. |
| 2011/0193178 A1 | 8/2011 | Chang et al. |
| 2011/0316080 A1 | 12/2011 | Luo et al. |
| 2012/0138886 A1 | 6/2012 | Kuhn et al. |
| 2013/0043506 A1 | 2/2013 | Tsai et al. |

OTHER PUBLICATIONS

"Tutorial: Intel 22nm 3D Tri-Gate FinFETs Transistors," RMG & Associates, Inc., accessed on Oct. 1, 2012, retrieved from URL= http://maltiel-consulting.com/Intel_22nm_3D_Tri-Gate_FinFETs_Transistors_maltiel_semiconductor_consulting.html, 8 pages.

Crothers, "How Intel's 3D tech redefines the transistor (FAQ)," CNETNews.com, dated May 4, 2011, accessed on Feb. 28, 2013, retrieved from URL= http://news.cnet.com/8301-13924_3-20059431-64.html, 10 pages.

Extended European Search Report for EP Application No. 13194927.3 dated Feb. 28, 2014, 12 pages.

Jurczak et al., "Silicon-on-Nothing (SON)—an Innovative Process for Advanced CMOS", IEEE Transactions on Electron Devices, vol. 47, No. 11, Nov. 2000, 10 pages.

Markoff, "Intel Increases Transistor Speed by Building Upward," NYTimes.com, dated May 5, 2011, accessed on Sep. 13, 2012, retrieved from URL=http://www.nytimes.com/2011/05/05/science/05chip.html, 3 pages.

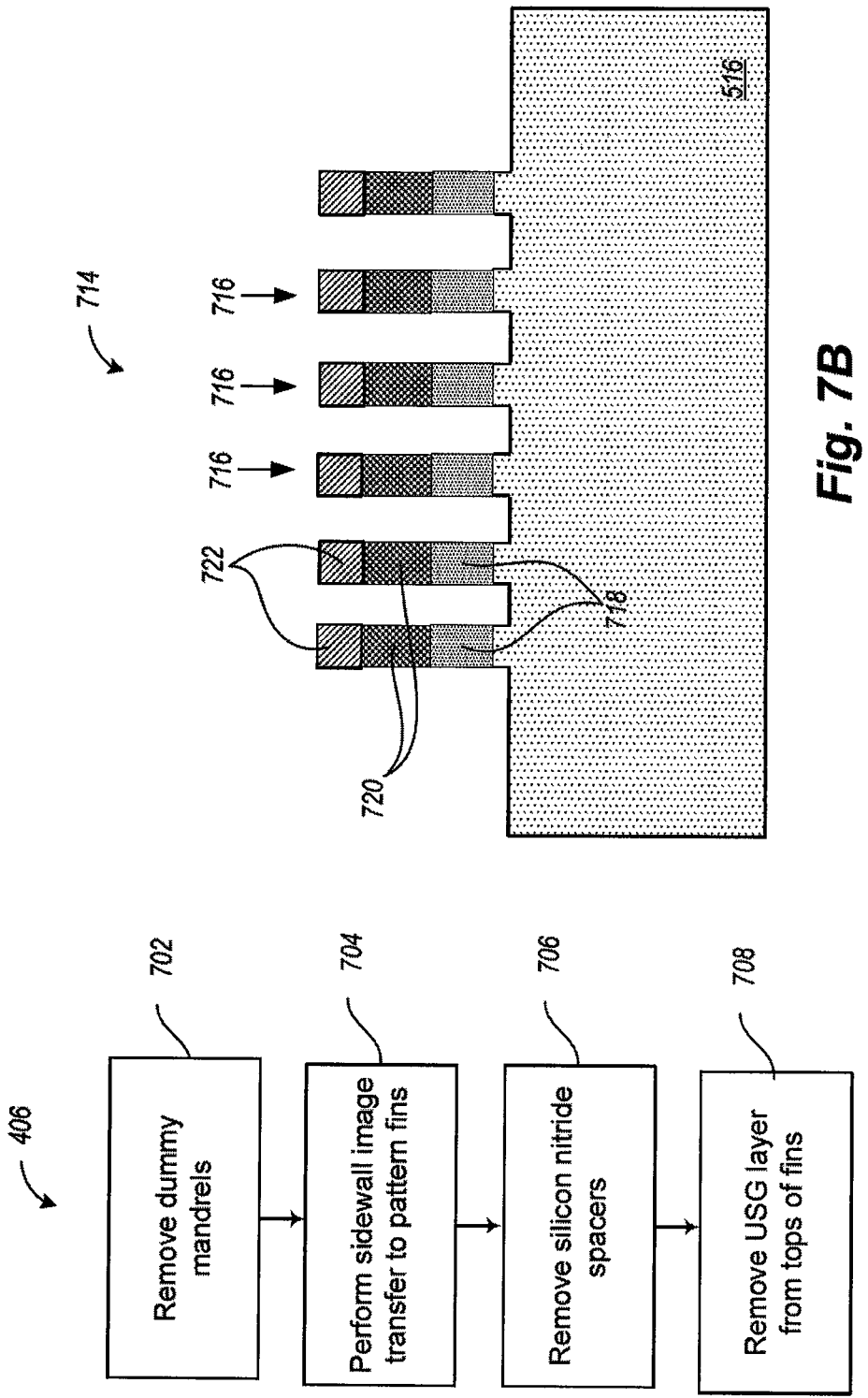

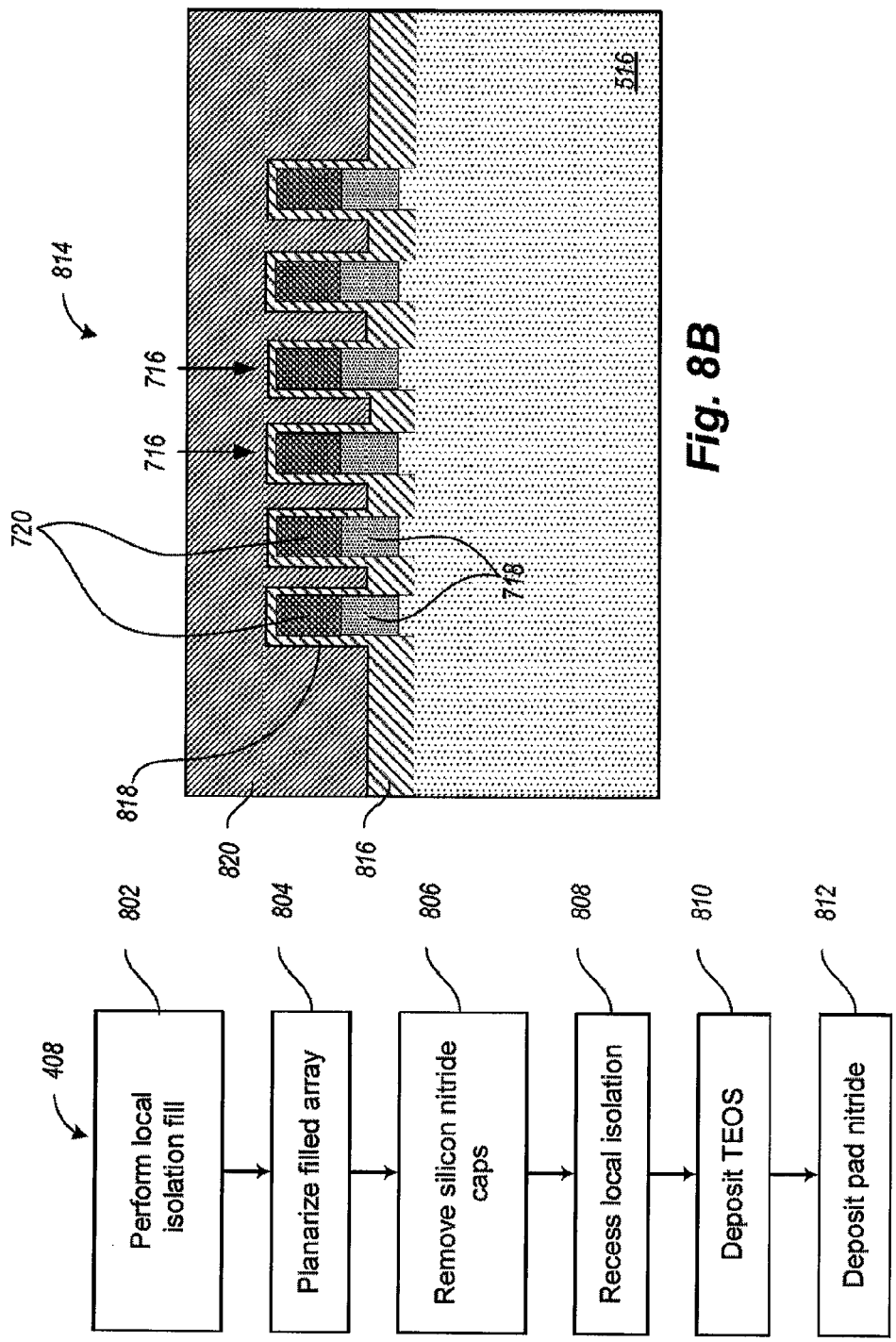

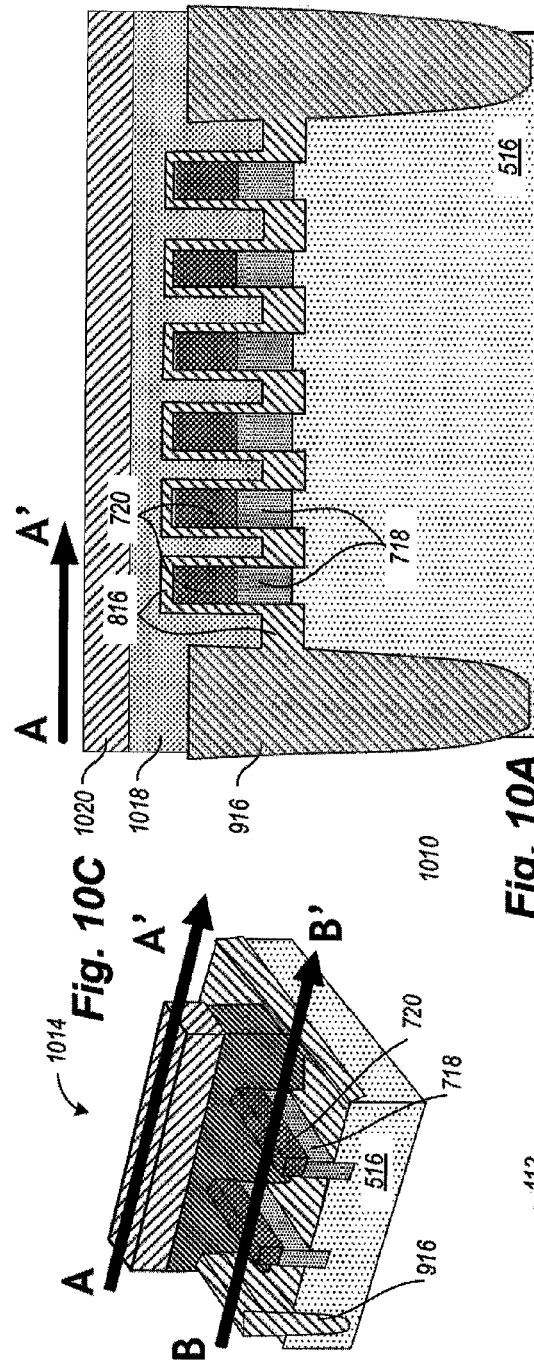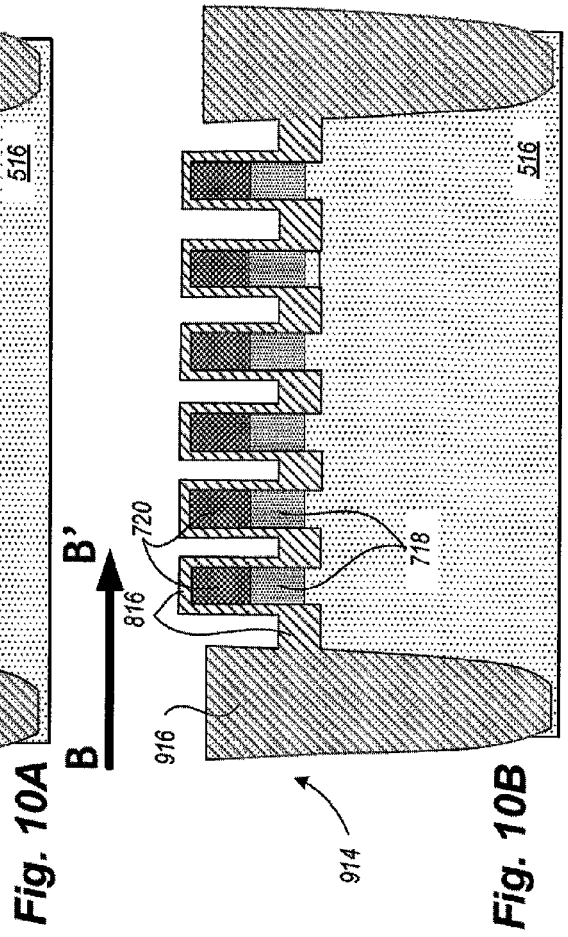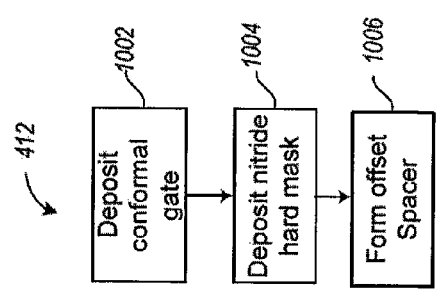

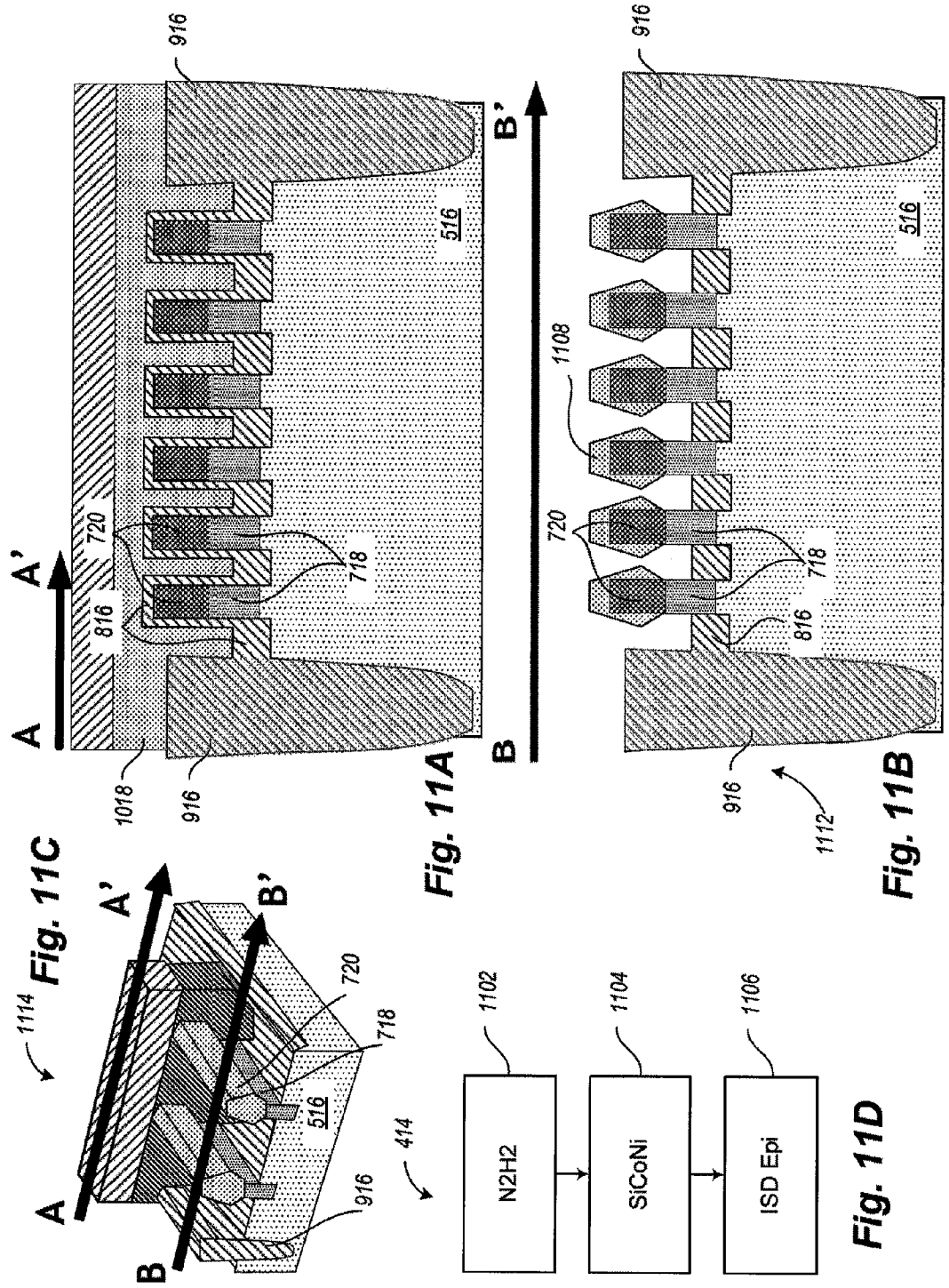

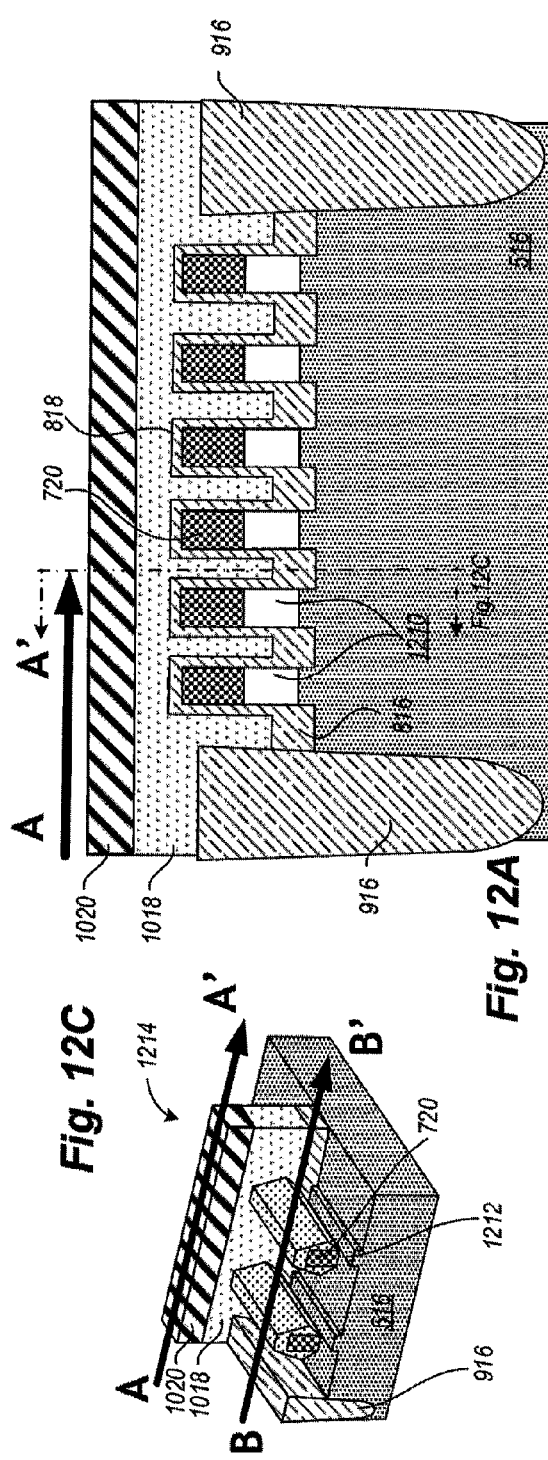
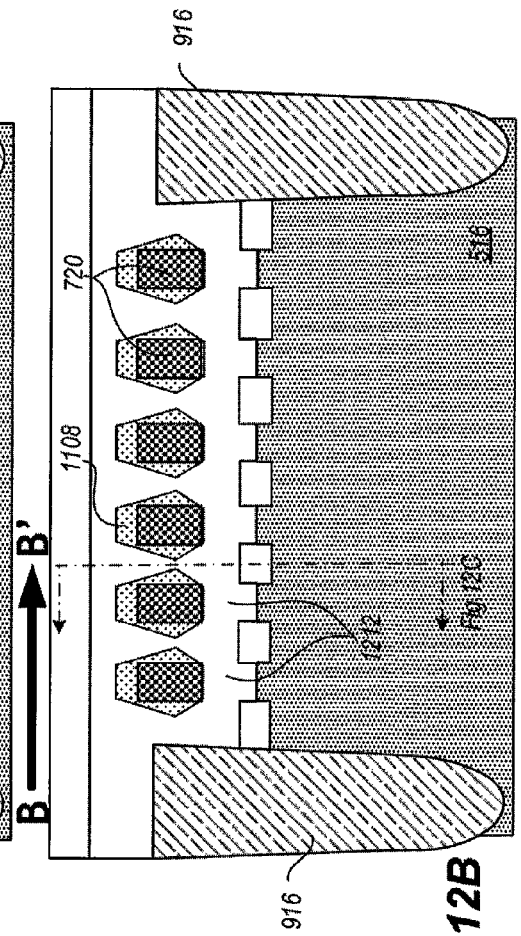
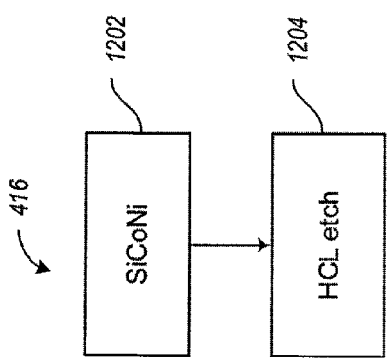
Fig. 12A
Fig. 12B
Fig. 12C
Fig. 12D

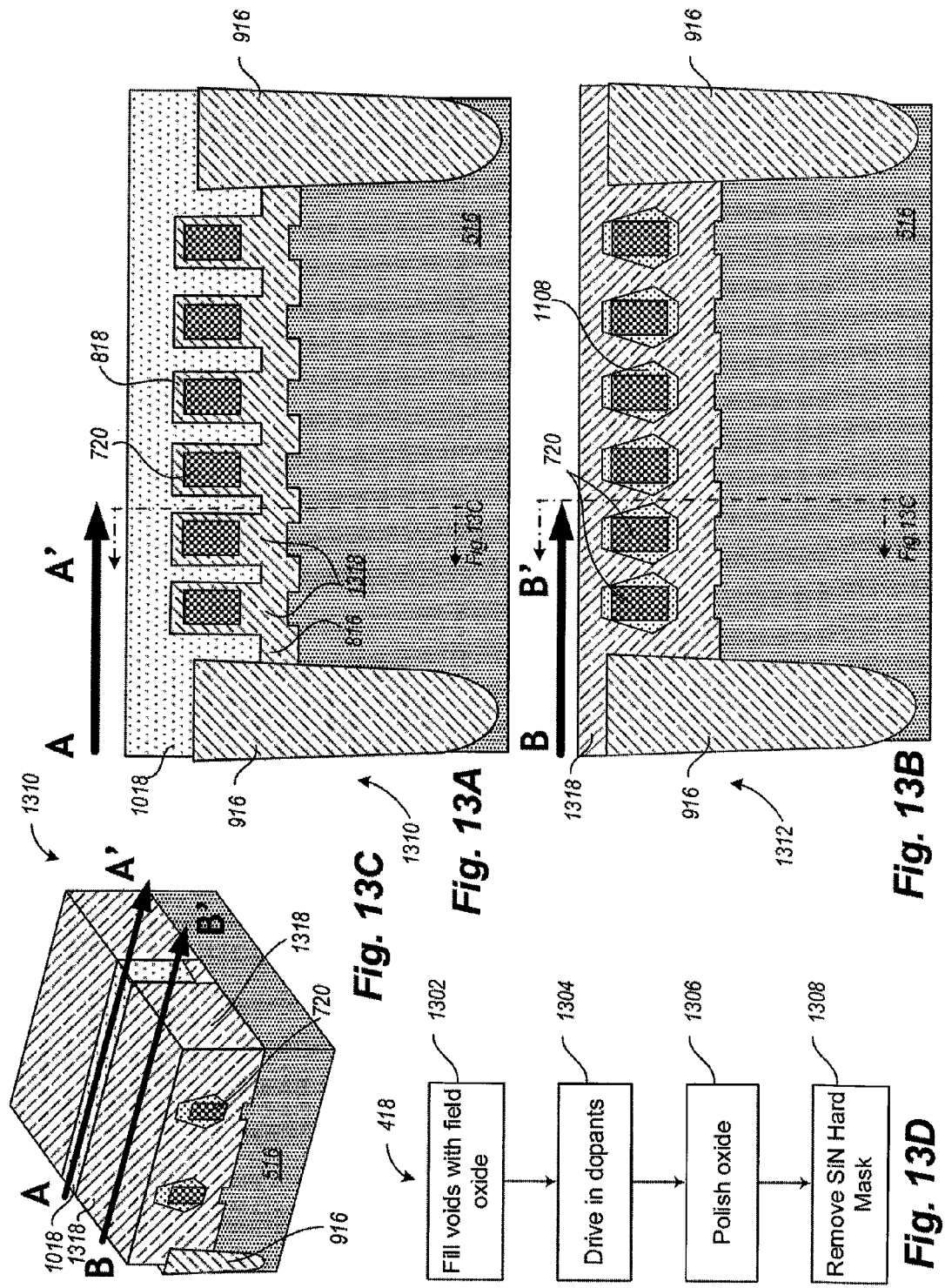

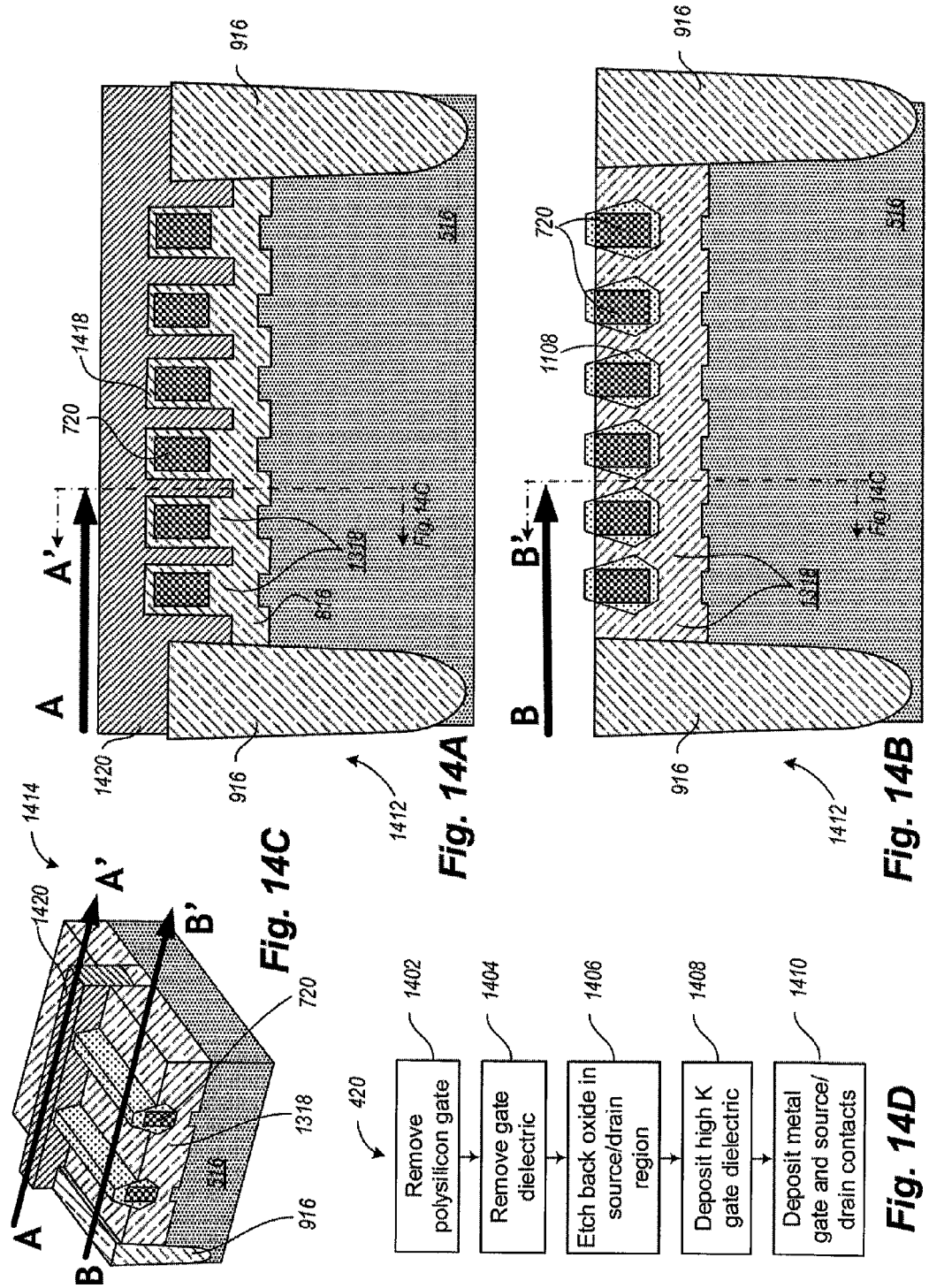

FULLY SUBSTRATE-ISOLATED FINFET TRANSISTOR

BACKGROUND

Technical Field

The present disclosure relates to the fabrication of integrated circuit transistors, and, in particular, low-leakage three-dimensional FinFET (field effect transistor) devices.

Description of the Related Art

In a digital circuit, a transistor is a switch which ideally: a) passes zero current when it is off; b) supplies large current flow when it is on; and c) switches instantly between the on and off states. Unfortunately, a transistor is not ideal as constructed in an integrated circuit and tends to leak current even when it is off. Current that leaks through, or out of, the device tends to drain the battery that supplies power to the device. For many years, integrated circuit transistor performance was improved by shrinking critical dimensions to increase switching speed. However, as dimensions of silicon-based transistors continue to shrink, maintaining control of various electrical characteristics, including off-state leakage, becomes increasingly more challenging, while performance benefits derived from shrinking the device dimensions have become less significant. It is therefore advantageous, in general, to reduce leakage current in the transistor by alternative means, including changes in materials and device geometry Integrated circuits typically incorporate FETs in which current flows through a semiconducting channel between a source and a drain, in response to a voltage applied to a gate. A traditional planar (2-D) transistor structure is shown in FIG. 1A and described below in greater detail. To provide better control of the current flow, FinFET transistors, sometimes called 3D transistors, have been developed, such as the one shown in FIG. 1B. A FinFET is an electronic switching device in which the planar semiconducting channel of a traditional FET is replaced by a semiconducting fin that extends outward, normal to the substrate surface. In such a device, the gate, which controls current flow in the fin, wraps around three sides of the fin so as to influence the current flow from three surfaces instead of one. The improved control achieved with a FinFET design results in faster switching performance and reduced current leakage.

Intel described this type of transistor in an announcement on May 4, 2011, calling it by various names including a 3D transistor, a 3-D Tri-Gate transistor, or a FinFET. (See, for example, the article titled "How Intel's 3D tech redefines the transistor" located on the internet at http://news.cnet.com/8301-13924_3-20059431-64.html; see also U.S. Publication No. 2009/0090976 to Kavalieros et al., published on Apr. 9, 2009; U.S. Pat. No. 8,120,073 to Rakshit et al.; U.S. Pat. No. 7,973,389 to Rios et al.; U.S. Pat. No. 7,456,476 to Hareland et al.; and U.S. Pat. No. 7,427,794 to Chau et al.)

An array of semiconducting fins is shown in FIG. 2. Typically, an array of multiple transistors can be formed by conformally depositing a common gate over an array of fins. Furthermore, an array of multi-gate transistors can be formed by conformally depositing multiple common gates over the array of fins. Such a FinFET array having three gates between source and drain regions is known as a tri-gate transistor.

Prior to the development of FinFETs, strained silicon transistors were developed to increase control of the mobility of charge carriers in the semiconducting channel. Introducing compressive strain into the transistor materials tends to increase charge mobility, resulting in a faster switching response to changes in voltage applied to the gate. Strain can be introduced, for example, by replacing bulk silicon in the source and drain regions, or in the channel itself, with epitaxially grown silicon compounds. The term epitaxy refers to a controlled process of crystal growth in which a new, epitaxial, layer of a crystal is grown from the surface of a bulk crystal, while maintaining the same crystal structure of the underlying bulk crystal.

Despite improvements provided by three-dimensional structures and strained silicon materials, transistors continue to suffer certain types of performance degradation as device dimensions shrink into the range of 1-50 nanometers. These include, in particular, leakage of charge between the semiconducting channel and the substrate.

BRIEF SUMMARY

According to one embodiment as described herein, channel-to-substrate leakage in a FinFET device is prevented by isolating the channel, which is the fin, from the substrate by inserting an insulating layer between the channel and the substrate. The insulating layer isolates the fin from the substrate both physically and electrically, thus preventing current leakage between the fin and the substrate. Theoretically, when there is no leakage, the device is either all on or all off.

If the fins contain two different materials, the bottom material can be easily removed, while leaving the top material, thus yielding an array of semiconducting fins suspended above the silicon surface. A resulting gap underneath the remaining top fin material can then be filled in with oxide if desired to better support the fins and to isolate the array of fin channels from the substrate.

Similarly, according to one embodiment as described herein, source/drain-to-substrate leakage in a FinFET device is prevented by isolating the source/drain regions from the substrate by inserting an insulating layer between the source/drain regions and the substrate. The insulating layer isolates the source/drain regions from the substrate both physically and electrically, thus preventing current leakage between the source/drain and the substrate. Thus, the resulting FinFET device is fully substrate-isolated in both the gate region and the source/drain regions.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

FIG. 7A illustrates a process flow diagram showing a further sequence of process steps that can be used to pattern the fin stack using a sidewall image transfer process.

FIG. 7B is a side view of a device profile formed by the process flow shown in FIG. 7A, in which a completed multi-layer array of epitaxial fins is shown.

FIG. 8A is a process flow diagram showing a further sequence of process steps that can be used to provide localized isolation for the epitaxial fin array shown in FIG. 7B.

FIG. 8B is a side view of a device profile formed by the process flow shown in FIG. 8A, in which inter-fin isolation is established.

FIGS. 10A, 11A, 12A, 13A, and 14A are side views cut along lines A-A' of the FinFET device profile in the gate region during a process in which the channel and the source/drain regions are isolated from the substrate.

FIGS. 10B, 11B, 12B, 13B, and 14B are side views cut along lines B-B' of the FinFET device profile in the source/drain region during a process in which the channel and the source/drain regions are isolated from the substrate.

FIGS. 10C, 11C, 12C, 13C, and 14C are expanded isometric views of a portion of the transistor structure as described herein, showing both changes in the gate region extending along the line A-A', and changes in the source/drain region profiles extending along the line B-B', as the isolated gate and source/drain structures are being formed.

FIG. 10D is a process flow diagram showing a further sequence of process steps that can be used to deposit a sacrificial gate and spacers.

FIG. 11D is a process flow diagram showing a further sequence of process steps that can be used to prepare surfaces of the top layers of the fins for in-situ-doped epitaxial growth.

FIG. 12D is a process flow diagram showing a further sequence of process steps that can be used to remove the bottom fin layers to create voids.

FIG. 13D is a process flow diagram showing a further sequence of process steps that can be used to fill the voids with an oxide to isolate the fins from the substrate.

FIG. 14D is a process flow diagram showing a further sequence of process steps that can be used to replace the sacrificial gate with an operable metal gate.

DETAILED DESCRIPTION

Figures 1A, 1B:
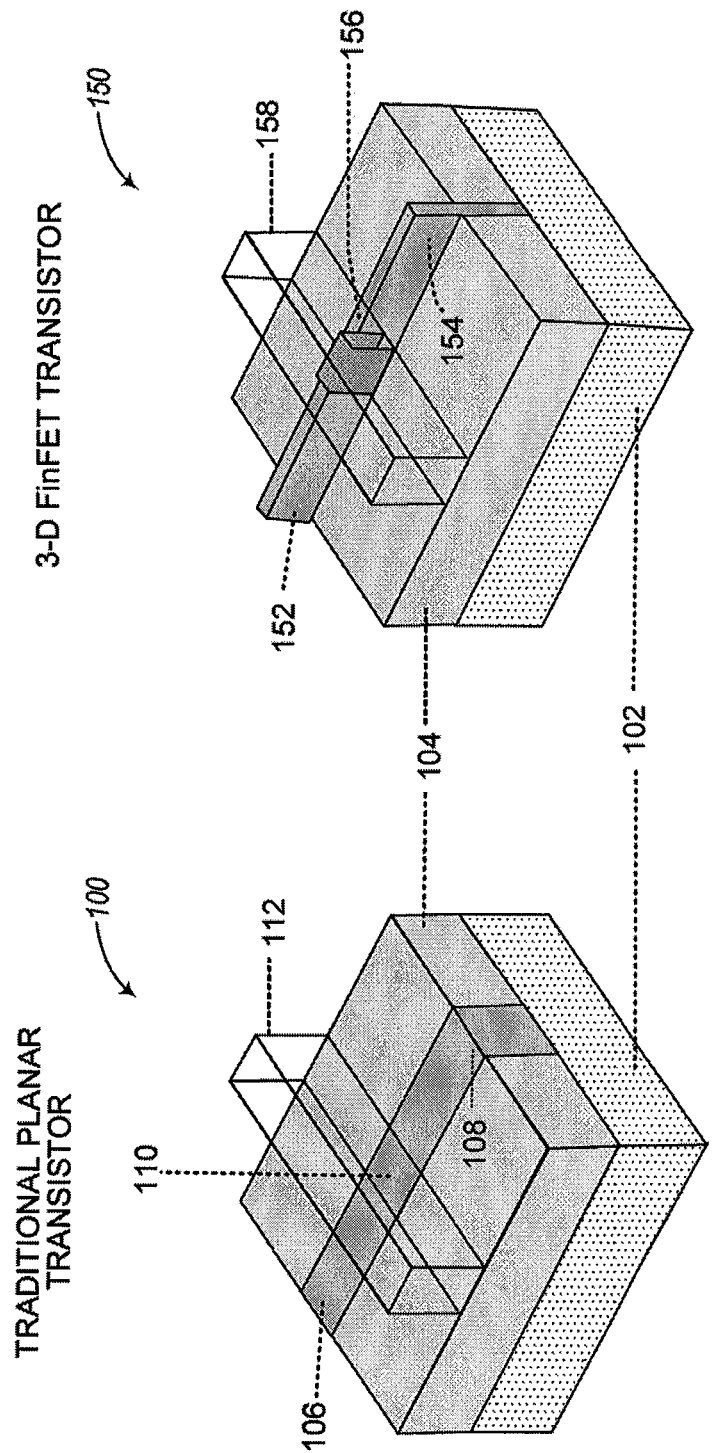
FIG. 1A is a pictorial perspective view of a prior art planar FET.
FIG. 1B is a pictorial perspective view of a prior art FinFET.

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to insulating materials or semiconducting materials can include various materials other than those used to illustrate specific embodiments of the transistor devices presented. The term "epitaxial silicon compounds" should not be construed narrowly to limit an epitaxially grown structure to Si or SiGe, for example, but rather, the term "epitaxial silicon compounds" is broadly construed to cover any compounds that can be grown epitaxially from a crystalline silicon surface.

Reference throughout the specification to conventional thin film deposition techniques for depositing silicon nitride, silicon dioxide, metals, or similar materials include such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electro-less plating. Furthermore, reference to conventional techniques of thin film formation may include growing a film in-situ. For example, in some embodiments, controlled growth of an oxide to a desired thickness can be achieved by exposing a silicon surface to oxygen gas or to moisture in a heated chamber.

Reference throughout the specification to conventional photolithography techniques, known in the art of semiconductor fabrication for patterning various thin films, include a spin-expose-develop process sequence involving a photoresist. Such a photolithography sequence entails spinning on the photoresist, exposing areas of the photoresist to ultraviolet light through a patterned mask, and developing away exposed (or alternatively, unexposed) areas of the photoresist, thereby transferring a positive or negative mask pattern to the photoresist. The photoresist mask can then be used to etch the mask pattern into one or more underlying films. Typically, a photoresist mask is effective if the subsequent etch is relatively shallow, because photoresist is likely to be consumed during the etch process. Otherwise, the photoresist can be used to pattern a hard mask, which in turn, can be used to pattern a thicker underlying film.

Reference throughout the specification to conventional etching techniques known in the art of semiconductor fabrication for selective removal of polysilicon, silicon nitride, silicon dioxide, metals, photoresist, polyimide, or similar materials include such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable. For example, stripping photoresist may entail immersing a sample in a wet chemical bath or, alternatively, spraying wet chemicals directly onto the sample.

Specific embodiments are described herein with reference to examples of FinFET structures that have been produced; however, the present disclosure and the reference to certain materials, dimensions, and the details and ordering of processing steps are exemplary and should not necessarily be limited to those shown.

In the figures, identical reference numbers identify similar features or elements. The sizes and relative positions of the features in the figures are not necessarily drawn to scale.

FIG. 1A shows a conventional planar transistor 100 built on a silicon substrate 102. Parts of the conventional planar transistor include an active region 104, a source 106, a drain 108, a planar conducting channel 110, and a gate 112. A gate dielectric, not shown, electrically isolates the channel from the gate, as is well known in the art. The active region 104 occupies a top layer of the substrate that may be doped with impurities to create a well having a net negative or net positive charge. When the conventional planar transistor 100 is on, current flows from the source 106 to the drain 108, through the planar conducting channel 110. Current flow in the planar conducting channel is controlled by the gate 112 by application of a gate voltage. An electric field associated with the gate voltage has the effect of turning on the conventional planar transistor 100 if the gate voltage exceeds a certain threshold. If the applied gate voltage drops below the threshold voltage, the conventional planar transistor 100 shuts off and current ceases to flow from the source 106 to the drain 108. Because the gate 112 can only influence the planar conducting channel 110 from one side (i.e., from the top of the planar conducting channel 110), charge leakage into the silicon substrate 102 tends to occur at the channel/substrate junction.

FIG. 1B shows a conventional FinFET device 150 built on the silicon substrate 102. Analogous to the device shown in FIG. 1A, parts of the conventional FinFET device 150 include an active region 104, a source 152, a drain 154, a conducting fin channel 156, and a wrap-around gate 158. The active region 104 of the conventional FinFET device 150 may be doped with impurities to create a well having a net negative or net positive charge. When the conventional FinFET device 150 is on, current flows from the source 152 to the drain 154, through the tall, conducting fin channel 156, under control of the wrap-around gate 158. Application of a voltage having a value that exceeds a certain threshold voltage value turns the conventional FinFET device 150 on. If the applied voltage drops below the threshold voltage value, the conventional FinFET device 150 shuts off and current ceases to flow from the source 152 to the drain 154. Because the wrap-around gate 158 influences the conducting fin channel 156 from three sides, improved control of the conduction properties of the conducting fin channel 156 is achieved. Such improved control causes leakage of charge from the conducting fin channel 156 to the silicon substrate 102 to be reduced, although not eliminated. Because the current-carrying capacity of the fin channel 160 is much greater than that of the planar conducting channel 110, the switching characteristics of the conventional FinFET device 150 are also improved over those of the conventional planar transistor 100.

Figure 2:
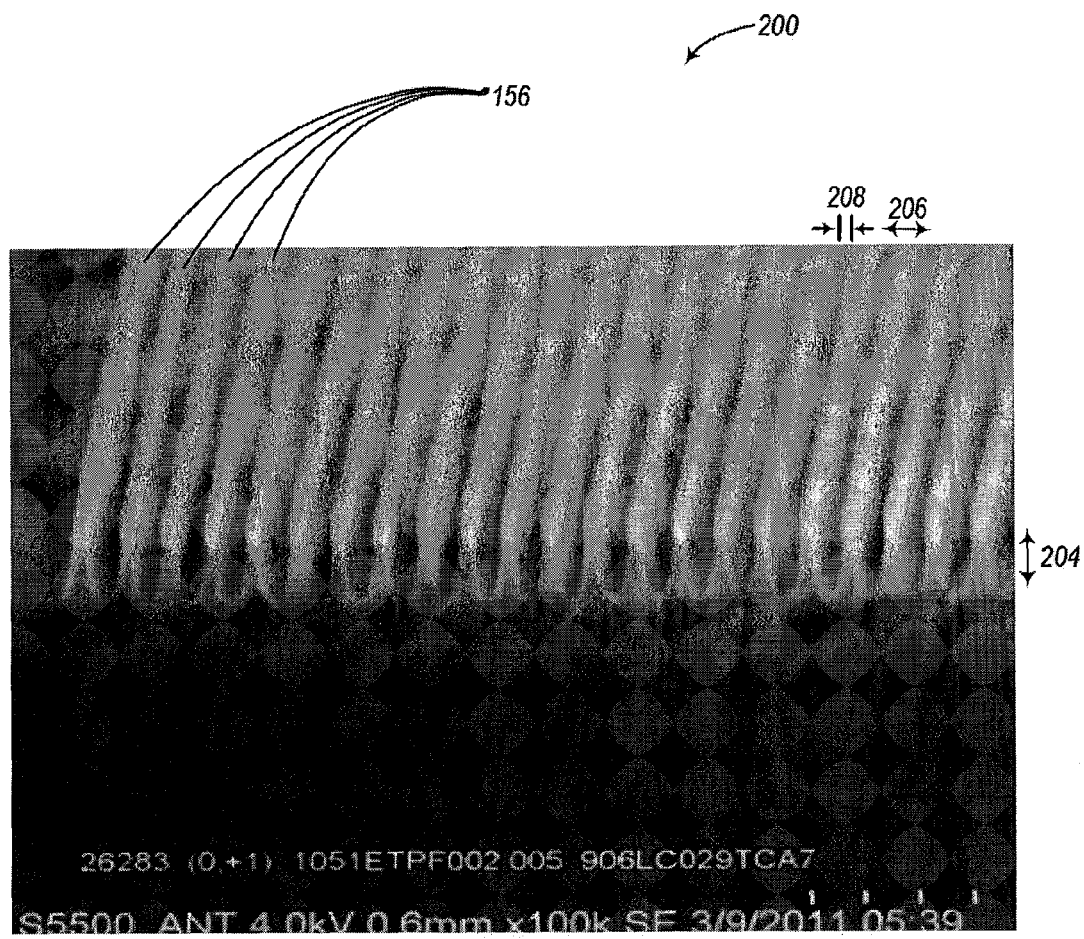
FIG. 2 is a perspective view of an array of epitaxially grown semiconducting fins, derived from an actual scanning electron microscope (SEM) image.

FIG. 2 shows an array of epitaxially grown semiconducting fins 200. Fins 156 for a fully substrate-isolated FinFET transistor as described herein can be constructed at the 22 nm technology node and smaller. For example, the width of fin 156 may be in the range of 18-22 nm, the fin height 204 in the range of 25-100 nm, with a range of 50-75 nm preferred. The space 208 between the fins 156 can be in the same range as the width of the fins, for example, 18-22 nm.

The pitch 206 of the fins, namely, distance from the center of one fin 156 to the center of the next fin 156, which is also the distance from the center of one space 208 to the center of the next space 208, will generally be in the range of 40-48 nm for a 22 nm fin and is usually double the width of a fin 156. Thus, for a fin width of 18 nm, a pitch 206 of 36 nm is preferred, but pitches in the range of 30-50 nm may also be used. Fins 156 having these general dimensions and smaller are used for the various embodiments of the invention, as will now be explained with respect to FIGS. 3-14D. As semiconductor processes advance, the dimensions can also change to match available technology. For example, the fins may be in the range of 8-20 nm in width and have heights that are in the range of 10-200 nm, depending on the desired design characteristic and the geometries available.

Figure 3:
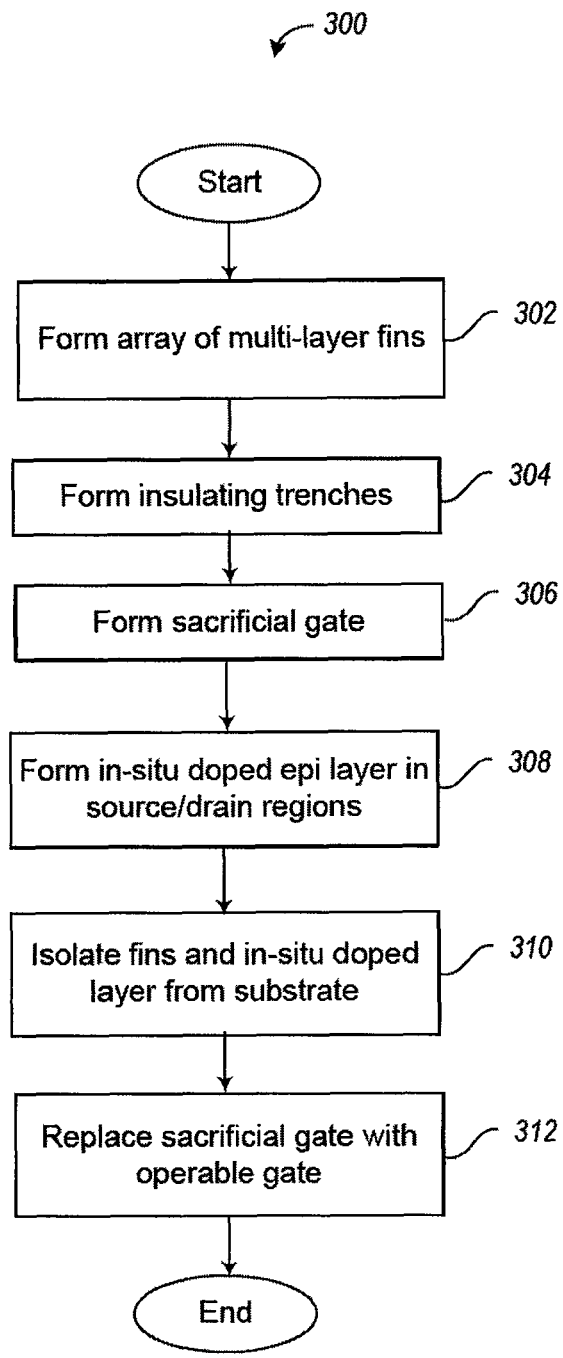
FIG. 3 is a high-level process flow diagram showing basic steps in forming a fully isolated FinFET as described herein.

FIG. 3 is a high-level flow diagram describing basic actions in a fabrication process 300 for a fully isolated FinFET device designed to prevent channel-to-substrate leakage and source/drain-to-substrate leakage. At 302, an array of multi-layer semiconducting fins is formed using a sidewall image transfer (SIT) process. At 304, a pair of trenches are formed in the silicon substrate and filled with an insulating material to electrically isolate the semiconducting fins from neighboring regions. At 306, a sacrificial gate is formed. At 308, an epitaxial layer is grown laterally outward from the top layer of the semiconducting fins, while being doped in-situ. At 310, the semiconducting fins and the in-situ doped layer are isolated from the substrate by insertion of an insulating layer. At 312, the sacrificial gate is replaced with an operable gate.

Figure 4:
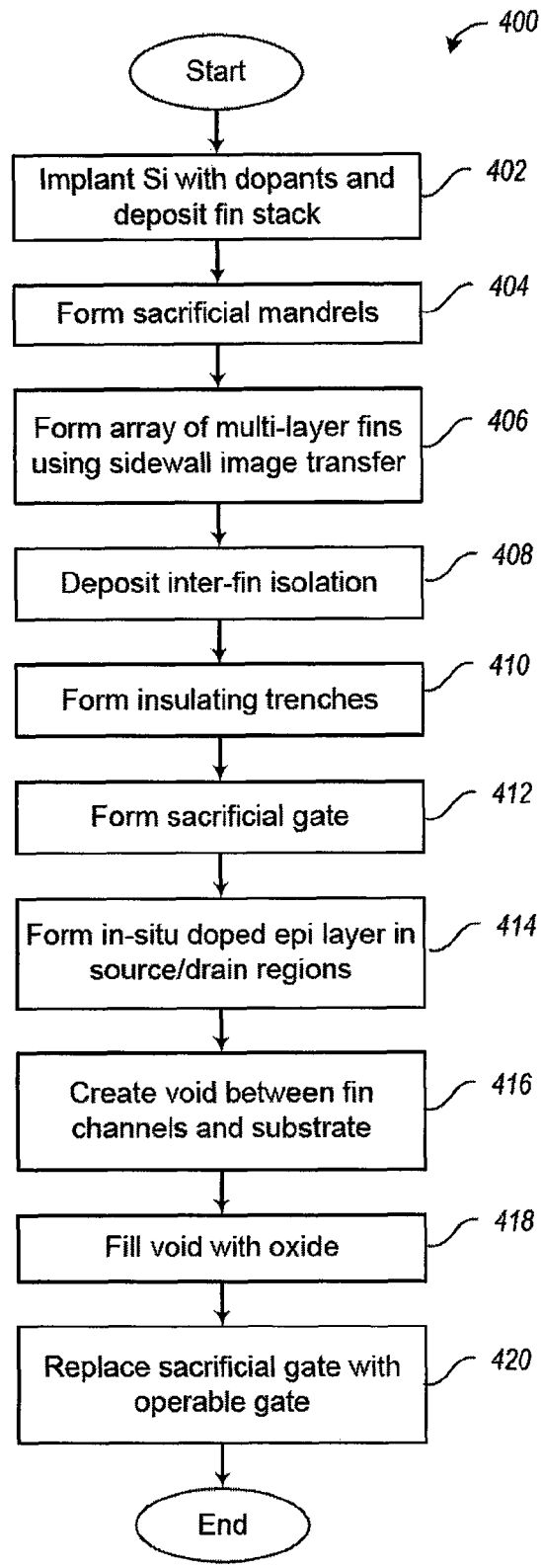
FIG. 4 is a medium-level process flow diagram showing additional details in the process of forming the fully isolated FinFET as described herein.

FIG. 4 is a lower-level flow diagram describing a more detailed fabrication process 400 for the fully isolated FinFET device described in FIG. 3. At 402, the silicon substrate is implanted, and a fin stack of blanket layers is deposited. The blanket layers include an epitaxially-grown bi-layer, silicon nitride, and an un-doped silicate glass (USG). At 404, a dummy mandrel structure is formed by patterning the nitride and the USG films. At 406, the dummy mandrel is used to perform a sidewall image transfer (SIT) process to create an array of semiconducting fins, and then the mandrel is removed. At 408, spaces between the semiconducting fins are filled with an insulating material to provide localized inter-fin isolation. At 410, isolation trenches are etched and filled with an insulating oxide. At 412, a sacrificial polysilicon gate and offset spacer are formed in the gate regions while, at 414, in the source/drain regions, an in-situ doped (ISD) epitaxial layer is grown isotropically from the top layer of each fin. At 416, a bottom layer of the epitaxially-grown bi-layer is removed in both the gate region and the source/drain regions, creating voids. At 418, the voids are filled with an insulating material such as an oxide. At 420, the sacrificial polysilicon gate is removed and replaced with an operable metal gate.

With reference to FIGS. 5A-14D below, each set of figures shows one of the process steps from FIG. 4 in more detail by presenting a more comprehensive sequence of process steps and a corresponding side view that results upon completion of that sequence of steps.

Figures 5A, 5B:
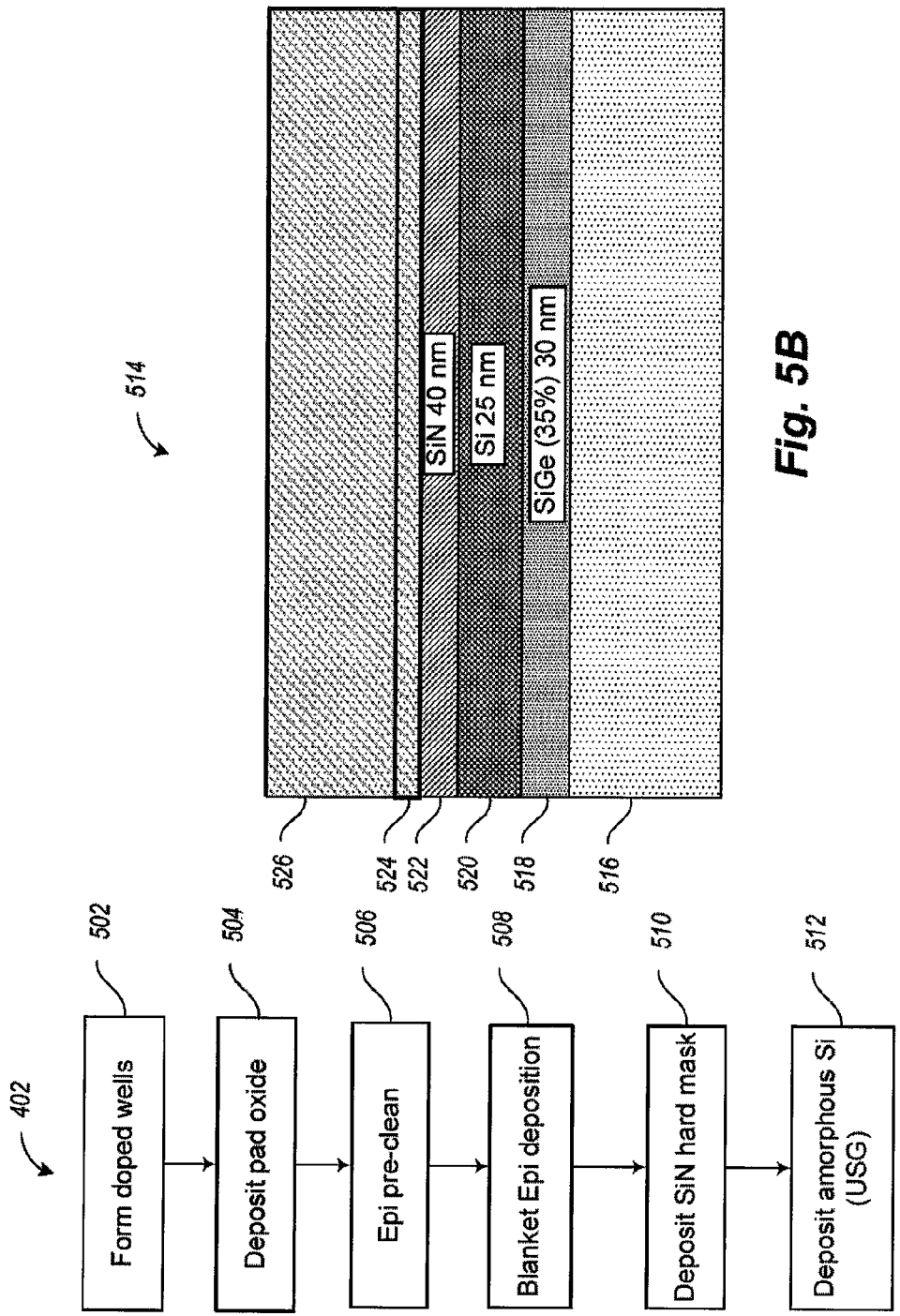
FIG. 5A is a process flow diagram showing a sequence of process steps that can be used to implant the silicon substrate with dopants, and to form a fin stack, in accordance with one embodiment.
FIG. 5B is a side view of a device profile formed by the process flow shown in FIG. 5A, in which blanket layers making up the fin stack are shown.

FIGS. 5A and 5B illustrate the step 402 in greater detail, in which the silicon substrate is implanted, and a fin stack of blanket layers is deposited in accordance with one embodiment. FIG. 5A shows a sequence of process steps including the steps 502, 504, 506, 508, 510, and 512 that can be carried out to form the blanket layer stack 514 shown in FIG. 5B. The blanket layer stack 514 includes a silicon substrate 516, a blanket epitaxially-grown semiconducting bottom layer 518, (e.g., silicon germanium (SiGe) or another epitaxial silicon compound), a blanket epitaxially-grown semiconducting top layer 520 (e.g., silicon or an epitaxial silicon compound), a blanket silicon nitride cap layer 522, and first and second blanket sacrificial layers of un-doped amorphous silicate glass (USG), 524 and 526, respectively.

At 502, the silicon substrate can receive well implants to become doped with either p-type or n-type atoms, depending on whether the device being fabricated is designed as an N-P-N or a P-N-P transistor, respectively.

At 504, a pad oxide layer can be deposited or grown. At 506, an epitaxial pre-clean step can be performed to prepare the surface of the silicon substrate for epitaxial crystal growth. Typically, an epitaxial pre-clean step removes all surface oxide, (including native oxide and the pad oxide layer deposited at 504) using a wet chemical treatment such as hydrofluoric acid (HF).

At 508, the epitaxial semiconducting bottom layer 518 is grown. The semiconducting bottom layer 518 can be made of silicon germanium in which the germanium content is desirably about 35%, and the thickness is desirably about 30 nm. The germanium content of the semiconducting bottom layer 518 can range from about 20% to about 60%. The thickness of the semiconducting bottom layer 518 can be within the range of about 20 nm-60 nm. In addition, at 508, the epitaxially-grown semiconducting top layer 520 is formed by epitaxial crystal growth from a top surface of the silicon germanium semiconducting bottom layer 518. The semiconducting top layer 520 can be made of silicon or silicon germanium, having a thickness in the range of about 25 nm-50 nm.

At 510, the epitaxial semiconducting top layer 520 can be capped with the blanket silicon nitride cap layer 522. The silicon nitride cap layer 522 can be deposited to be used as a hard mask having a thickness of about 40 nm. At 512, the first and second sacrificial blanket layers of USG, 524 and 526, respectively, can be deposited using, for example, conventional methods such as those typically used in the art to deposit polysilicon. The first sacrificial blanket layer of USG 524 desirably has a thickness within the range of about 20 nm-40 nm. The second blanket sacrificial layer of USG 526 desirably has a thickness within the range of about 80 nm-120 nm. The first and second sacrificial layers of USG can be substantially the same, or they can be differentiated by density, for example, or by a change in one or more other film properties that can produce different etch rates for the two USG films in subsequent processing steps.

Figures 6A, 6B:
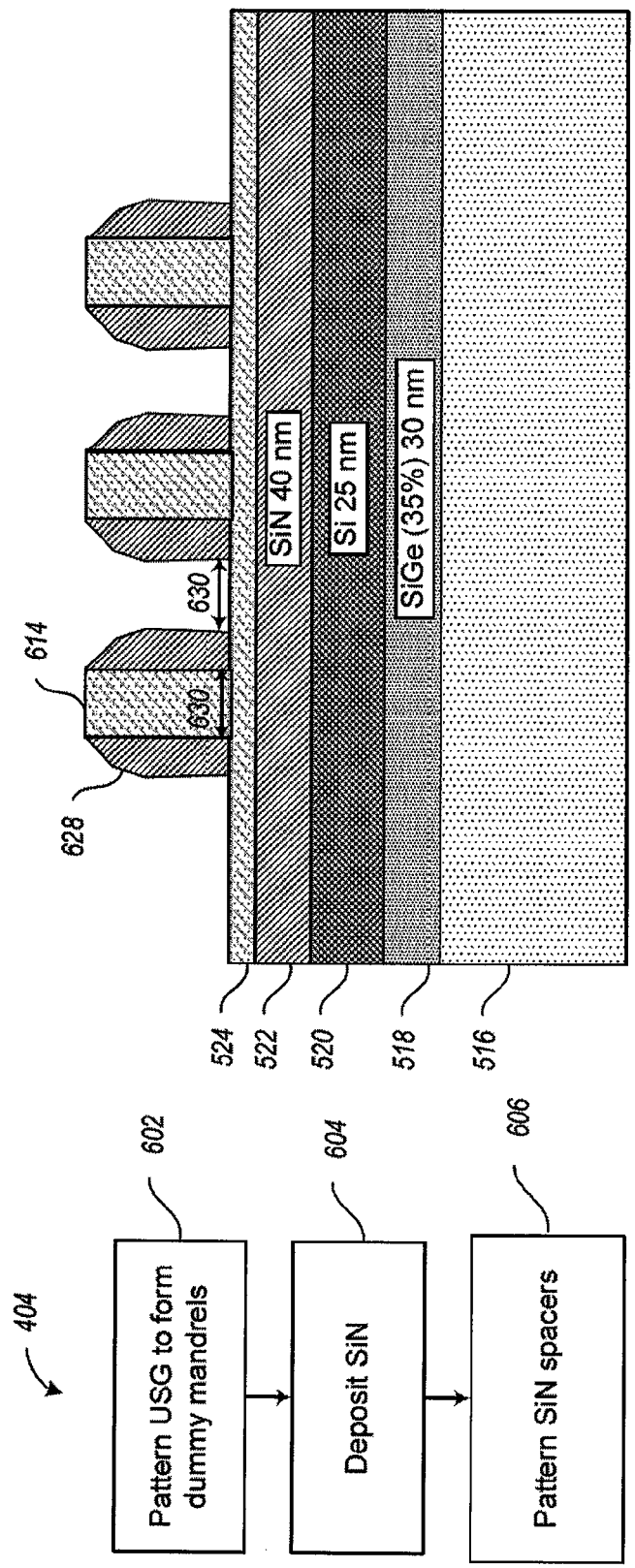
FIG. 6A is a process flow diagram showing a further sequence of process steps that can be used to form dummy mandrels and silicon nitride spacers.
FIG. 6B is a side view of a device profile formed by the process flow shown in FIG. 6A, in which completed sacrificial structures are shown.

FIGS. 6A and 6B illustrate the step 404 in greater detail, in which sacrificial mandrels are formed to support sidewall spacers that are used as mask structures in an unconventional sidewall image transfer (SIT) process. The SIT process can be especially useful for patterning narrow and/or closely spaced structures. FIG. 6A shows a sequence of process steps, including the steps 602, 604, and 606 that can be carried out to form sacrificial (dummy) mandrels 614 (three shown) in FIG. 6B. Each mandrel 614 is a patterned un-doped amorphous silicate glass (USG) structure supporting a pair of sidewall spacers 628. In the SIT process, the width of the sidewall spacers 628 will be transferred to the width of the multi-layer fins instead of using a mask to pattern the fins. The width of the resulting multi-layer fins in an exemplary embodiment is desirably within the range of about 3-15 nm. In addition, a mandrel width 630 determines an inter-fin spacing which, in the exemplary embodiment, is desirably in the range of about 10-50 nm. Likewise, the uniformity of the sidewall spacers 628 and of the mandrels 614 determines the uniformity of fins and fin spacing, respectively, within the fin array.

At 602, the blanket sacrificial layer of un-doped amorphous silicate glass (USG) 526 can be patterned to form the mandrels 614, using conventional photolithography and etch processes. Because conventional photolithography is well known to those skilled in the art of semiconductor processing, it is not explicitly shown in the figures, but will be described briefly. Conventional photolithography entails spinning on a photoresist, exposing portions of the photoresist to ultraviolet light through a patterned mask, and developing away the unexposed portions of the photoresist, thereby transferring the mask pattern to the photoresist. The photoresist mask can then be used to etch the pattern into one or more underlying layers. Typically, a photoresist mask can be used if the subsequent etch is relatively shallow, because photoresist is likely to be consumed during the etch process. The second sacrificial layer of USG 526 can be patterned using such a photoresist mask and a wet etch or RIE chemistry that is selective to the first sacrificial layer of USG. Alternatively, a timed etch can be used, in which partial consumption of the first sacrificial layer of USG 524 is acceptable.

At 604, a conformal silicon nitride layer (not shown) can be deposited over the USG structures 526 using a conventional deposition technique.

At 606 a blanket (no-mask) wet or dry etch can be performed to remove a uniform thickness of the nitride layer, thus forming the pair of sidewall spacers 628. In such a process, the mandrels 614 can be used as an etch stop layer, or the etch process can be timed. Because the first blanket sacrificial layer of USG 524 and the mandrels 614 are both temporary, a non-optimum etch selectivity resulting in partial consumption of these layers may be acceptable. Depending on the etch process used, the sidewall spacers 628 may slope away from the top surfaces of the mandrels 614 slightly or significantly.

FIGS. 7A and 7B illustrate the step 406 in greater detail, in which an array of multi-layer fins is patterned by transferring the footprint (image) of the sidewall spacers 628 to the blanket layer stack 514. FIG. 7A shows a sequence of process steps including the steps 702, 704, 706, and 708 that can be carried out to form an array of multi-layer fins 714 (six shown) in FIG. 7B. According to one embodiment, each multi-layer fin 716 includes a patterned epitaxial silicon germanium bottom layer 718, a patterned epitaxial silicon top layer 720, shown in FIG. 7 as covered by a residual patterned silicon nitride cap 722.

At 702, after the sidewall spacers 628 are formed, the dummy mandrels 614 can be removed by etching the USG using either a wet etch or a dry etch that is highly selective to the silicon nitride sidewall spacers 628. The etchant used to remove the mandrels 614 will then also tend to remove the first sacrificial layer of USG 524 except where it is protected underneath the sidewall spacers 628.

At 704, the SIT process can be performed in which the remaining sub-10 nm sidewall spacers 628 in the exemplary embodiment are used as a hard mask when etching the full stack of underlying layers (524, 522, 520, and 518). When the sidewall image transfer is complete, the resulting multi-layer fins 716 extending vertically from the silicon substrate 516, as shown in FIG. 7B, will have approximately the same width and uniformity as the footprints of the sidewall spacers 628. Thus, the image of the sidewall spacers has been transferred to the fins.

At 706, following the fin formation, the remaining sidewall spacers 628 covering the multi-layer fins 716 can be removed using a conventional wet etchant such as, for example, hot phosphoric acid, or another etchant that is selective to the bulk silicon substrate 516 and the epitaxial silicon bottom and top layers 718 and 720, respectively.

At 708, portions of the first sacrificial layer of USG 524 that remain on top of the multi-layer fins 716 as the residual USG cap (not shown) can be removed using, for example, an HF-based chemistry, thus leaving behind the multi-layer fins 716 including silicon nitride caps 722.

FIGS. 8A and 8B illustrate the step 408 in greater detail, in which insulating materials can be deposited between the multi-layer fins 716 to form a locally isolated multi-layer fin array 814. FIG. 8A shows a sequence of process steps including the steps 802, 804, 806, 808, 810, and 812 that can be carried out to form the locally isolated multi-layer fin array 814 (six fins shown) in FIG. 8B. According to one embodiment, the multi-layer fins 716 are separated by a localized inter-fin isolation fill material 816 and a tetraethyl orthosilicate (TEOS)-derived oxide layer, or TEOS 818.

At 802, spaces between the multi-layer fins 716 can be filled with the local isolation fill material 816, for example, an oxide.

At 804, the filled multi-fin array can then be planarized using a chemical-mechanical planarization (CMP) process that stops on the nitride caps 722.

At 806, the silicon nitride caps 722 can be removed using a wet chemical etchant that is at least partially selective to the underlying epitaxial silicon top layer 720. A portion of the epitaxial top layer 720 may also be removed.

At 808, the local isolation fill material 816 can be recessed using an etchant that is selective to silicon such as an HF-based wet chemical etch. The final thickness of the recessed local isolation fill material 816 is desirably such that the top surface of the recessed local isolation fill material 816 intersects the multi-layer fins 716 at a point located within the epitaxial silicon germanium bottom layer 718.

At 810, a thin TEOS layer 818 (e.g., less than about 10 nm thick) can be conformally deposited over the multi-fin array 814. The TEOS layer 818 will serve as a gate dielectric.

At 812, a pad nitride layer 820 can be deposited so as to replace the recessed fill material 816 and extend above the height of the multi-layer fin array 814. The pad nitride layer 820 can be used as a hard mask to form isolation trenches.

Figures 9A, 9B:
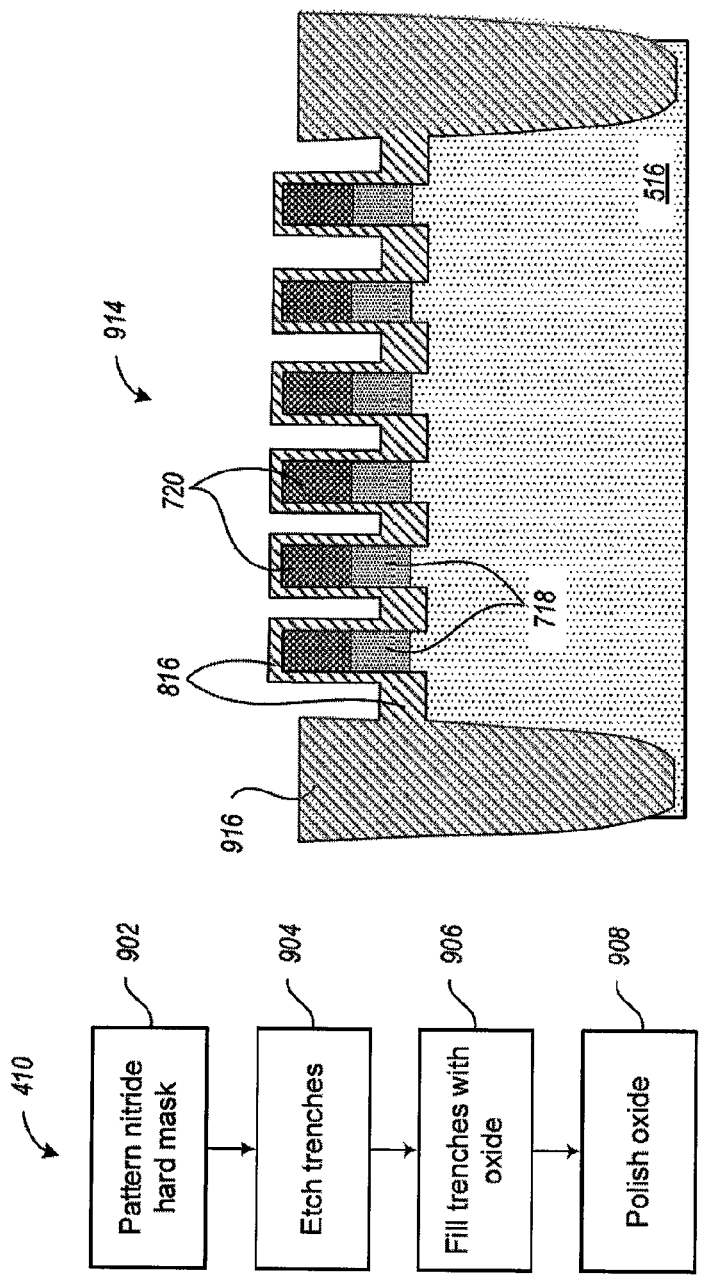
FIG. 9A is a process flow diagram showing a further sequence of process steps that can be used to etch and fill isolation trenches on either end of the fin array.
FIG. 9B is a side view of a device profile formed by the process flow shown in FIG. 9A, in which lateral isolation is provided between the fin array and neighboring regions.

FIGS. 9A and 9B illustrate the step 410 in greater detail, in which insulating trenches are formed on either side of the multi-fin array 814 to isolate the array of multi-layer fins 914 from neighboring regions. FIG. 9A shows a sequence of process steps including the steps 902, 904, 906, 908, 910, and 912, that can be carried out to form a laterally isolated array of fins 914 shown in FIG. 9B.

At 902, the pad nitride layer 820 can be patterned using a conventional photolithography technique as described above, so as to cover the multi-fin array 814 and to expose the areas beyond the ends of the multi-fin array 814.

At 904, the pad nitride layer 820 can then be used as a hard mask during an etch process that removes local isolation fill material 816 and silicon, to create deep trenches in the silicon substrate 516. The etch process used to create the isolation trenches is desirably an anisotropic plasma etch.

At 906, the deep isolation trenches can be filled with an insulator. The insulator can be, for example, a silicon dioxide such as a high aspect ratio process (HARP™) fill material 916. Such a HARP™ fill material 916 can be deposited using a proprietary process that is executed on specialized chemical vapor deposition (CVD) equipment available from Applied Materials, Inc. of Santa Clara, Calif.

At 908, the HARP™ fill material 916 can be planarized using a CMP process that stops on the pad nitride layer 920.

At 910, the HARP™ fill material 916 can be recessed using an HF dip, followed by a nitride removal step (e.g., a hot phosphoric acid wet etch) at 912. In the resulting exemplary laterally isolated array of fins 914, as shown in FIG. 9B, the height of the HARP™ fill material 916 is below the height of the fins, but above the junction of the two epitaxial silicon layers 718 and 720 within the fins.

FIGS. 10A, 10B, and 10C illustrate the step 412 in greater detail, in which a sacrificial gate and spacers are formed. FIG. 10D shows a sequence of process steps including the steps 1002, 1004, and 1006 that can be carried out to form a sacrificial gate 1018 overlying the laterally isolated array of six fins 914 in the gate region (FIG. 10A). A perspective view of the resulting FinFET array 1014 (only two fins shown) is shown in FIG. 10C.

At 1002, the sacrificial gate 1018 can be conformally deposited over the laterally isolated fin array 914, and aligned substantially orthogonally to the fins. The sacrificial gate 1018 is thus contiguous to three sides of each multi-layer fin. The sacrificial gate 1018 can be made of polysilicon, for example, in accordance with techniques used to form conventional planar transistor gates. The sacrificial gate 1018 is At 1004, a blanket silicon nitride hard mask layer 1020 can be deposited. The sacrificial gate 1018 and the silicon nitride hard mask layer 1020 are formed only in the gate regions, not in the source/drain regions. This can be accomplished by depositing the materials through a deposition mask. Or, the films can be blanket-deposited over both the gate and the source/drain regions, and then selectively removed from the source and drain regions (FIG. 10B) so that both the sacrificial gate 1018 and the silicon nitride hard mask layer 1020 remain only in the gate regions (FIG. 10A).

FIG. 10B is thus substantially a reproduction of FIG. 9B. FIG. 10A is a side view of the FinFET array in the gate region, along a cut line A-A', as shown in the perspective view 1014 presented in FIG. 10C. FIG. 10B is a side view of the FinFET array in the source/drain regions, along a cut line B-B', as shown in the perspective view 1014 presented in FIG. 10C. Because the conformal gate is not deposited over the source/drain regions, FIG. 10B shows the same structure 914 that appears in FIG. 9B, prior to formation of the conformal gate along A-A'.

At 1006, an offset spacer can be formed on either side of the sacrificial gate structure using another conventional deposition and patterning (lithography and etch) cycle. The spacers can be made of, for example, silicon nitride. The spacers appear in FIG. 10C, however, neither the cut from A-A' nor the cut from B-B' intersects the spacers, so they do not appear in the side views shown in FIG. 10A or 10B.

FIGS. 11A, 11B, and 11C illustrate the step 414 in greater detail, in which an in-situ doped (ISD) layer is epitaxially grown from the semiconducting top layer 520. FIG. 11D shows a sequence of process steps including the steps 1102, 1104, and 1106 that can be carried out to form a doped array of fins 1112 in the source/drain regions (FIG. 11B). A perspective view of the doped array of fins 1114 is shown in FIG. 11C.

At 1102, a first pre-clean can be done using N2H2 gas.

At 1104, a second pre-clean SiCoNi can be done, similar to that which is known in the art as a pre-clean prior to nickel-silicide formation. The pre-clean steps 1102 and 1104 remove native oxide, impurities, and the like from the silicon surface to permit epitaxial crystal growth to occur unobstructed by surface contaminants.

At 1106, crystalline silicon can be epitaxially grown outward from the patterned epitaxial silicon top layer 720 of the multi-layer fins to form a faceted in-situ doped (ISD) structure 1108. In-situ doping can be accomplished by the introduction of impurities such as Boron or Phosphorous during the epitaxial growth. If the epitaxial growth is sustained throughout a sufficiently long time interval, the faceted ISD structures 1108 extending out from the top layers of the fins can grow together to form an epitaxial layer in contact with the recessed oxide 816.

FIGS. 12A, 12B, and 12C illustrate the step 416 in greater detail, in which the bottom layer of the conductive fin channels is removed to create voids between the top semiconducting material and the substrate. FIG. 12D shows a sequence of process steps including the steps 1202, and 1204 that can be carried out to form gate region voids 1210 (FIG. 12A) and source/drain region voids 1212 (FIG. 12B). A perspective view 1214 following void formation is shown in FIG. 12C.

At 1202, another SiCoNi pre-clean can be performed to facilitate more effective film removal in the subsequent step.

At 1204, the epitaxial bottom layer 718 can be removed from the fins in both the gate region and the source/drain regions using, for example, immersion in a hydrochloric acid solution to create the gate region voids 1210 and the source/drain region voids 1212. The epitaxial top layer 720 remains suspended above the substrate, but anchored to the gate structure in the perpendicular direction (i.e., along the fins).

In an alternative process flow, epitaxial growth of the faceted ISD structures 1108 shown in FIG. 11B can occur after the gate region voids 1210 and the source/drain region voids 1212 are formed.

FIGS. 13A, 13B, and 13C illustrate the step 418 in greater detail, in which the gate region voids 1210 and the source/drain region voids 1212 can be filled with an oxide 1318 to physically and electrically insulate the conductive fin channels from the substrate. FIG. 13D shows a sequence of process steps including the steps 1302, 1304, 1306, and 1308 that can be carried out to form an array of substrate-isolated fin channels 1310 in the gate regions (FIG. 13A) extending to substrate-isolated fins 1312 in the source/drain regions (FIG. 13B). A perspective view 1310 of the fully substrate-isolated fin channels is shown in FIG. 13C.

At 1302, the gate region voids 1210 and the source/drain region voids 1212 can be filled by growing silicon dioxide 1318 from the surface of the silicon substrate 516 in both the gate and source/drain regions. Then, in the source/drain regions, additional oxide 1318 can be either grown or deposited to a height slightly above the height of the silicon nitride spacers and hard mask on top of the gate.

At 1304, a conventional annealing process can be performed to diffuse dopants within the faceted ISD structures 1108 in the source/drain regions.

At 1306 the oxide 1318 can be polished using, for example, a conventional CMP process in which the silicon nitride hard mask layer 1020 can serve as a polish stop layer.

At 1308 the silicon nitride hard mask 1020 can be removed from the gate without removing the silicon nitride sidewall spacers by using an anisotropic (downward-directed) plasma etch process, followed by a conventional wet chemical cleaning step.

FIGS. 14A, 14B, and 14C illustrate the step 420 in greater detail, in which the sacrificial polysilicon gate 1018 is replaced with an operable metal gate 1420. Such a process is known to those skilled in the art as a replacement metal gate (RMG) process. FIG. 14D shows a sequence of process steps 420 including the steps 1402, 1404, 1406, 1408, and 1410 that can be carried out to form the operable gate structure 1412 in the gate regions (FIG. 14A). A perspective view 1414 of the operable gate structure 1412 is shown in FIG. 14C.

At 1402 the sacrificial polysilicon gate 1018 can be removed using, for example, a wet chemical etchant that attacks silicon selective to silicon nitride and silicon dioxide. Or, a two-part dry etch process can be used to remove the polysilicon gate 1018 and the gate dielectric in the same process step (1404).

At 1406, the oxide 1318 in the source/drain region can be etched back to a height that coincides with the epitaxial top layer 720 as shown in FIG. 14B.

At 1408 a high-k gate dielectric 1418 having a high dielectric constant ($\kappa$) of greater than about 4.0 can be conformally deposited over the epitaxial top layer 720 in the gate region.

At 1410, an operable metal gate 1420 can be deposited in the gate region, and also in the source/drain regions as a metal contact layer to the isolated fins (i.e., the epitaxial top layer 720). The operable metal gate 1420, like the sacrificial polysilicon gate 1018, is contiguous to three sides of each multi-layer fin, so that an electric potential applied to the gate can influence current flowing within the fin channel from each of three directions.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

It will be appreciated that, although specific embodiments of the present disclosure are described herein for purposes of illustration, various modifications may be made without departing from the spirit and scope of the present disclosure. Accordingly, the present disclosure is not limited except as by the appended claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
    a substrate;

a fin suspended over the substrate and spaced apart from the substrate, the fin having a first surface that faces the substrate;

an insulating layer between the fin and the substrate, the first surface of the fin being between a surface of the insulating layer and the substrate; and a doped layer on the fin, the doped layer suspended over the substrate and spaced apart from the substrate by the insulating layer.

2. The device of claim 1, further comprising a gate overlying a channel region of the fin, the doped layer being disposed on source and drain regions of the fin.

3. The device of claim 2 wherein the gate includes a gate dielectric layer having a dielectric constant greater than 4.0, and a bulk gate material that includes a metal.

4. The device of claim 1 wherein the doped layer abuts at least three surfaces of the fin.

5. The device of claim 1 wherein the doped layer surrounds a portion of the fin.

6. The device of claim 1, wherein the insulating layer is on sides of the doped layer.

7. The device of claim 6 wherein the insulating layer completely surrounds the doped layer.

8. The device of claim 1 wherein the surface of the insulating layer is substantially coplanar with a second surface of the fin that is opposite to the first surface.

9. The device of claim 8 wherein a portion of the doped layer extends from the second surface of the fin to a level that is above the surface of the insulating layer.

10. A device, comprising:
a substrate;
an array of suspended fins, the fins spaced apart from the substrate;
an insulating material between the fins and the substrate and between adjacent ones of the fins;
a doped layer in contact with the fins at source/drain regions of the fins, the doped layer being spaced apart from the substrate by the insulating material, the insulating material abuts side surfaces of the doped layer between the adjacent ones of the fins; and
a gate structure on channel regions of the fins.

11. The device of claim 10 wherein the insulating material surrounds at least three sides of the doped layer.

12. The device of claim 10 wherein the substrate includes a plurality of raised regions, each raised region being aligned with one of the fins.

13. The device of claim 10 wherein a first dimension of at least one of the fin structures at the channel region is 22 nm or smaller.

14. The device of claim 10 wherein the gate structure includes a conductive material that overlaps at least two of the fins.

15. The device of claim 10 wherein the doped layer is on at least three sides of each of the fins.

16. A device, comprising:
a substrate;
an insulating layer on the substrate, the insulating layer having a surface; and
a plurality of transistors isolated from the substrate, each of the transistors including:
a floating fin having a surface that faces the substrate, the surface of the floating fin being between the surface of the insulating layer and the substrate; and
a doped layer on the fin, the doped layer spaced apart from the substrate by the insulating layer.

17. The device of claim 16, further comprising a conformal gate structure overlying channel regions of the fins.

18. The device of claim 16 wherein the insulating layer is adjacent to at least three sides of the floating fin.

19. The device of claim 16 wherein the doped layer is on at least three sides of the fin and the insulating layer is on at least three sides of the doped layer.

20. The device of claim 16 wherein the doped layer of a respective fin abuts at least three surfaces of the fin.

21. A device comprising:
a substrate;
an array of suspended fins, the fins spaced apart from the substrate;
an insulating material between the fins and the substrate and between adjacent ones of the fins;
a doped layer in contact with the fins at source/drain regions of the fins, the doped layer being spaced apart from the substrate by the insulating material, the insulating material surrounds at least three sides of the doped layer; and
a gate structure on channel regions of the fins.

22. The device of claim 21 wherein the doped layer abuts at least three surfaces of each of the fins.

23. A device comprising:
a substrate including a plurality of raised regions;
an array of suspended fins, the fins spaced apart from the substrate, each of the raised regions being aligned with one of the fins;
an insulating material between the fins and the substrate and between adjacent ones of the fins;
a doped layer in contact with the fins at source/drain regions of the fins, the doped layer being spaced apart from the substrate by the insulating material; and
a gate structure on channel regions of the fins.

24. The device of claim 23 wherein each of the fins includes a first surface that faces the substrate, the first surface of each of the fins being between the substrate and a surface of the insulating material.

* * * * *